(12) United States Patent
Streck et al.

(10) Patent No.: US 7,829,460 B2
(45) Date of Patent: Nov. 9, 2010

(54) METHOD OF MANUFRACTURING INCREASING RELIABILITY OF COPPER-BASED METALLIZATION STRUCTURES IN A MICROSTRUCTURE DEVICE BY USING ALUMINUM NITRIDE

(75) Inventors: Christof Streck, Coswig (DE); Volker Kahlert, Dresden (DE)

(73) Assignee: GLOBALFOUNDRIES, Inc., Austin, TX (US)

( * ) Notice: Subject to any disclaimer, the term of this patent is extended or adjusted under 35 U.S.C. 154(b) by 452 days.

(21) Appl. No.: 11/948,245

(22) Filed: Nov. 30, 2007

(65) Prior Publication Data
US 2008/0179741 A1    Jul. 31, 2008

(30) Foreign Application Priority Data
Jan. 31, 2007    (DE) .................. 10 2007 004 867

(51) Int. Cl.
*H01L 21/44* (2006.01)
(52) U.S. Cl. ............... 438/653; 438/627; 438/643; 438/E21.129; 75/672; 75/673; 75/674
(58) Field of Classification Search ............ 438/627, 438/643, 653, 618–624; 75/672–674
See application file for complete search history.

(56) References Cited

U.S. PATENT DOCUMENTS

| 6,617,173 | B1 | 9/2003 | Sneh | 438/3 |
|---|---|---|---|---|
| 7,061,111 | B2 | 6/2006 | McTeer | 257/751 |
| 7,084,060 | B1 | 8/2006 | Furukawa | 438/677 |
| 2003/0003635 | A1 | 1/2003 | Paranjpe et al. | 438/149 |
| 2004/0121616 | A1 | 6/2004 | Satta et al. | 438/778 |
| 2006/0027922 | A1 | 2/2006 | Lee et al. | 257/750 |
| 2006/0134906 | A1 | 6/2006 | Lu et al. | 438/619 |
| 2006/0251813 | A1 | 11/2006 | Carlson et al. | 427/248.1 |
| 2010/0176369 | A2* | 7/2010 | Oliver et al. | 257/13 |

FOREIGN PATENT DOCUMENTS

| DE | 198 53 598 A1 | 2/2000 |
|---|---|---|
| WO | WO 01/78141 A2 | 10/2001 |
| WO | WO 01/78141 A3 | 10/2001 |
| WO | 2007/060640 A3 | 5/2007 |

OTHER PUBLICATIONS

International Search Report and Written Opinion mailed Jun. 10, 2008.
Translation of Official Communication from German Patent Office for German Patent Application No. 10 2007 004 867.1-33 dated Jul. 13, 2007.

* cited by examiner

*Primary Examiner*—Dung A. Le
(74) *Attorney, Agent, or Firm*—Williams, Morgan & Amerson (57) ABSTRACT

By forming an aluminum nitride layer by a self-limiting process sequence, the interface characteristics of a copper-based metallization layer may be significantly enhanced while nevertheless maintaining the overall permittivity of the layer stack at a lower level.

12 Claims, 5 Drawing Sheets

METHOD OF MANUFRACTURING INCREASING RELIABILITY OF COPPER-BASED METALLIZATION STRUCTURES IN A MICROSTRUCTURE DEVICE BY USING ALUMINUM NITRIDE

BACKGROUND OF THE INVENTION

1. Field of the Invention

Generally, the subject matter of the present disclosure relates to the formation of integrated circuits, and, more particularly, to the formation of metallization layers including highly conductive metals, such as copper, embedded into a dielectric material including a barrier material for enhancing electromigration performance of the metal.

2. Description of the Related Art

In modern integrated circuits, minimum feature sizes, such as the channel length of field effect transistors, have reached the deep sub-micron range, thereby steadily increasing performance of these circuits in terms of speed and/or power consumption. As the size of the individual circuit elements is significantly reduced, thereby improving, for example, the switching speed of the transistor elements, the available floor space for interconnect lines electrically connecting the individual circuit elements is also decreased. Consequently, the dimensions of these interconnect lines have to be reduced to compensate for a reduced amount of available floor space and for an increased number of circuit elements provided per unit area.

In integrated circuits having minimum dimensions of approximately 0.35 µm and less, a limiting factor of device performance is the signal propagation delay caused by the switching speed of the transistor elements. As the channel length of these transistor elements has now reached 50 nm and less, the signal propagation delay is no longer limited by the field effect transistors, but is limited, owing to the increased circuit density, by the interconnect lines, since the line-to-line capacitance (C) is increased, and the resistance (R) of the lines is also increased, due to their reduced cross-sectional area. The parasitic RC time constants, therefore, require the introduction of a new type of material for forming the metallization layer.

Traditionally, metallization layers, i.e., the wiring layers including metal lines and vias for providing the electrical connection of the circuit elements according to a specified circuit layout, are formed by a dielectric layer stack including, for example, silicon dioxide and/or silicon nitride with aluminum as the typical metal. Since aluminum suffers from significant electromigration at higher current densities that may be necessary in integrated circuits having extremely scaled feature sizes, aluminum is being replaced by, for instance, copper, which has a significantly lower electrical resistance and a higher resistivity against electromigration. For highly sophisticated applications, in addition to using copper and/or copper alloys, the well-established and well-known dielectric materials silicon dioxide ($k \approx 4.2$) and silicon nitride ($k>5$) may be replaced by so-called low-k dielectric materials having a relative permittivity of approximately 3.0 and less. However, the transition from the well-known and well-established aluminum/silicon dioxide metallization layer to a copper-based metallization layer, possibly in combination with a low-k dielectric material, is associated with a plurality of issues to be dealt with.

For example, copper may not be deposited in relatively high amounts in an efficient manner by well-established deposition methods, such as chemical and physical vapor deposition. Moreover, copper may not be efficiently patterned by well-established anisotropic etch processes. Therefore, the so-called damascene or inlaid technique is frequently employed in forming metallization layers including copper lines and vias. Typically, in the damascene technique, the dielectric layer is deposited and then patterned for receiving trenches and via openings that are subsequently filled with copper or alloys thereof by plating methods, such as electroplating or electroless plating. Moreover, since copper readily diffuses in a plurality of dielectrics, such as silicon dioxide and in many low-k dielectrics, the formation of a diffusion barrier layer at interfaces with the neighboring dielectric material may be required. Moreover, the diffusion of moisture and oxygen into the copper-based metal has to be suppressed as copper readily reacts to form oxidized portions, thereby possibly deteriorating the characteristics of the copper-based metal line with respect to adhesion, conductivity and the resistance against electromigration.

In order to not unduly reduce the overall conductivity of the metal region, conductive barrier materials are typically used for covering inner sidewall areas of trenches, while dielectric barrier materials are typically used as cap layers or dielectric barrier layers, which may also act as an efficient etch stop material in an etch process for fabricating a contact to the metal region by a via extending from a metal region of a next higher metallization level. For instance, silicon nitride is known as an effective copper diffusion barrier and may be used, for instance, as a dielectric barrier layer. In other cases, when the moderately high permittivity of silicon nitride is considered inappropriate, nitrogen-enriched silicon carbide (SiCN) is frequently used as a copper diffusion barrier. Despite the diffusion hindering effect of the silicon nitride barrier layers and silicon carbide based barrier layers, it turns out, however, that copper's resistance against electric current induced material transport (electromigration) or other stress-induced material transport effects strongly depends on the characteristics of an interface between the copper-based metal and the adjacent dielectric barrier layer. Therefore, in sophisticated integrated circuits featuring high current densities, it is generally important to design the interface between the copper-based metal and the dielectric barrier layer such that a desired high adhesion and, thus, high performance with respect to electromigration or stress-induced mass transport is achieved.

Hence, a plurality of approaches in this respect have been proposed and practiced in the art in order to obtain superior reliability, i.e., superior electromigration behavior, in combination with increased device performance, that is, low overall permittivity of the dielectric materials in the metallization layer. Therefore, many materials, such as SiN, SiC, SiCN and the like, and also various combinations of these materials, may be used as dielectric barrier material. However, it turns out that it is very difficult to meet both requirements, i.e., superior electromigration behavior and low-k properties, since many dielectric materials providing the desired diffusion blocking characteristics with respect to copper, oxygen, moisture and the like typically have a moderately high k value. Furthermore, the copper surface may be highly reactive after exposure and usually requires respective treatments prior to the deposition of the dielectric barrier material in order to remove copper oxide residues, which may provide diffusion paths for material migration during operation and which may also reduce adhesion of the barrier material. The respective pre-deposition treatment may, however, have a significant influence on the copper surface, thereby contributing to an inferior performance of the copper during the further processing and/or during the operation of the device. Thus, less aggressive treatments have been proposed in order to avoid undue damage of the copper-based material. In this respect, copper silicide or nitrogen-containing copper silicide (CuSiN) has been identified as an efficient alloy, which may result in a highly stable interface, thereby endowing the corresponding metal region with increased resistance and thus reliability with respect to electromigration and other stress-induced mass transport effects. Hence, in some conventional approaches, the copper surface is exposed to a reactive gas ambient, such as a plasma-assisted gas ambient, which may contain silane ($SiH_4$) as a silicon-containing precursor and a nitrogen-containing gas, thereby creating the copper silicide with a specific fraction of nitrogen. Usually, the process for forming the nitrogen-containing copper silicide (CuSiN) material at the exposed copper interface is performed immediately prior to the plasma enhanced chemical vapor deposition (PECVD) of the barrier material, such as silicon nitride, nitrogen-enriched silicon carbide or combinations thereof, wherein respective cleaning processes, such as plasma enhanced processes and the like, may be performed in order to prepare the copper surface for the subsequent formation of the nitrogen-containing copper silicide (CuSiN) alloy and the deposition of the dielectric barrier material. Thus, a plurality of complex processes may be involved that may interact with the copper surface and therefore result in complex surface conditions, which may therefore require precisely controlled process conditions during the formation of the nitrogen-containing copper silicide (CuSiN) material. It turns out that even minute variations of process conditions may result in significant differences of the composition of the resulting nitrogen-containing copper silicide (CuSiN) material, thereby even deteriorating the characteristics of the copper near the surface. Thus, although nitrogen-containing copper silicide (CuSiN) is a promising candidate for enhancing the performance of copper-based metallization structures, the process is difficult to control, since, for instance, a slight imbalance of the precursor materials may result in non-predictable performance characteristics of the metal line.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter of the present disclosure relates to a technique for forming an efficient dielectric barrier layer on an exposed metal-containing region, such as a copper-containing metal region, wherein self-limiting deposition techniques may be used in order to produce a continuous material film on the dielectric material and the metal region. Due to the highly controllable growth mechanism on the basis of chemical bonds, increased adhesion may be achieved wherein, in combination with appropriate materials, efficient diffusion blocking characteristics may also be provided, thereby potentially enabling omitting further dielectric materials or at least significantly reducing the thickness thereof. Consequently, superior performance characteristics may be obtained in terms of a reduced parasitic capacitance of the dielectric layer stack. In some aspects, a dielectric barrier layer formed on the basis of an atomic layer deposition (ALD) like process may be an aluminum and nitride containing layer, which will be referred to as an aluminum nitride layer, that will provide copper diffusion blocking characteristics and may also have superior getter capabilities with respect to oxygen and moisture. Hence, superior control of the deposition process on the basis of the self-limiting technique in combination with a reduced relative permittivity and respective diffusion blocking characteristics may therefore contribute to a significantly enhanced reliability of metallization structures in advanced semiconductor devices.

According to one illustrative embodiment, a method comprises forming a nitrogen-containing layer on an exposed surface of a metal region formed in a dielectric layer of a microstructure device. The method further comprises exposing the nitrogen-containing layer to an ambient established on the basis of an aluminum containing gas to form an aluminum and nitrogen containing first barrier layer on the metal region.

According to another illustrative embodiment, a method comprises providing a substrate having formed thereabove an exposed copper-containing metal region formed in a dielectric layer of a microstructure device. The method further comprises forming a dielectric barrier layer on the exposed copper-containing metal region and the dielectric layer by using a self-limiting reaction mechanism performed in a gaseous ambient.

According to yet another illustrative embodiment, a semiconductor device comprises a copper-containing region formed in a dielectric layer and an aluminum nitride layer formed on the copper-containing region and the dielectric layer. Furthermore, a low-k dielectric layer is formed above the aluminum nitride layer and a metal via is formed in the low-k dielectric layer that connects to the copper-containing region.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter of the present disclosure is directed to methods and semiconductor devices in which the reliability of metallization structures may be increased, for instance, by providing superior electromigration behavior while nevertheless providing overall low permittivity of the respective dielectric layer stack of the metallization layer. To this end, sophisticated deposition techniques may be used on the basis of appropriate dielectric materials so as to obtain enhanced controllability of the deposition process in combination with superior adhesion characteristics, while the type of material used may exhibit reduced permittivity or may at least provide the potential for reducing the amount of conventional dielectrics having a moderately high permittivity that may be required for reliably confining copper-based or other materials of high diffusivity formed within the dielectric layer stack. Thus, by using a well-controllable deposition technique, in combination with an appropriate material composition, well-defined interface characteristics may be established, which therefore contribute to superior electromigration behavior. Furthermore, in some aspects, the self-limiting deposition process may be advantageously combined with the deposition of further dielectric materials, such as an additional barrier layer or etch stop layer or a low-k dielectric material, thereby contributing to reduced process complexity, while also providing a high degree of flexibility in activating the corresponding self-limiting process. That is, well-established chemical vapor deposition (CVD) process tools may be used, in which appropriate plasma-assisted gaseous ambients may be established to activate the corresponding deposition process. In other cases, any other appropriate activation regimes, for instance using radiation, such as UV radiation, x-ray radiation and the like, may be used. Also, electron beam-assisted ALD-like deposition processes may be used. In illustrative aspects, an aluminum nitride layer may be formed on exposed copper-containing surfaces wherein the respective characteristics of the aluminum nitride material, such as its absorbing capability for oxygen and moisture, may provide enhanced integrity of the copper-containing surface, wherein the aluminum nitride material may even provide a copper diffusion blocking capability that may significantly relax respective requirements for any further dielectric barrier layer or which may even allow omitting a further additional barrier material, which typically may exhibit an increased relative permittivity. Furthermore, based on the ALD-like deposition process, the corresponding aluminum nitride layer may also be formed on appropriately prepared dielectric surfaces, thereby providing enhanced adhesion of the aluminum nitride layer, which may therefore result in an enhanced mechanical stability of the metallization level under consideration, in particular when low-k dielectric materials are used.

It should be appreciated that techniques disclosed herein are highly advantageous in the context of advanced microstructure devices, such as advanced integrated circuits, requiring copper-based metallization structures wherein at least some interfaces of the copper-containing metal with a surrounding dielectric material may require enhanced surface characteristics in view of stress-induced mass transport phenomena, such as electromigration, in order to enhance the reliability of the metallization structure, thereby also providing the potential for further device scaling. However, the disclosed techniques may also be applied to any other processes for forming microstructure devices in which efficient and reliable barrier layers in exposed copper-based surfaces may be required in a highly controllable manner. Thus, unless specifically pointed out in the specification or the appended claims, the subject matter of the present disclosure should not be considered as being restricted to metallization structures of semiconductor devices.

Figure 1A:
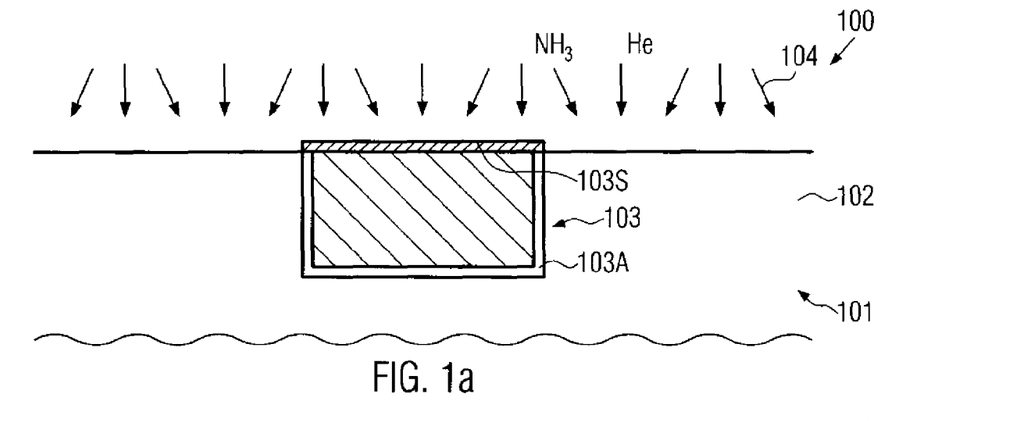
FIGS. 1a-1e schematically illustrate a microstructure device during various manufacturing stages in forming a dielectric barrier layer on a metal-containing region on the basis of a self-limiting process using an aluminum-containing precursor gas according to illustrative embodiments.

FIG. 1a schematically illustrates a cross-sectional view of a microstructure device 100 comprising a substrate 101 that may represent any appropriate carrier material for forming thereon or therein microstructure features requiring highly conductive metal regions, such as copper-containing metals. For instance, the microstructure device 100 may represent a semiconductor device formed above the substrate 101, which may thus represent a carrier material having formed thereon an appropriate semiconductor layer for forming therein respective circuit elements, such as transistors, capacitors and the like. The device 100 may include a dielectric layer 102, which may be comprised of any appropriate materials as are typically used for the fabrication of microstructure devices.

For instance, the dielectric layer 102 may comprise silicon dioxide, silicon nitride, silicon oxynitride and the like, wherein, in illustrative embodiments, the dielectric layer 102 may comprise a low-k dielectric material when, for instance, advanced integrated circuits are considered. A low-k dielectric material is to be understood as a material having a relative permittivity of 3.0 and less. The dielectric layer 102 has formed therein a metal region 103, which, in one illustrative embodiment, represents a copper-containing material having at least one exposed surface 103S, i.e., a surface that may not be covered by the dielectric material of the layer 102. It should be appreciated that, depending on the preceding process strategy, the exposed surface 103S may comprise a certain amount of oxide material or other contaminants which may have been formed during contact with respective reactive components, such as oxygen, fluorine and the like. As previously explained, copper readily diffuses in a plurality of dielectric materials, such as silicon dioxide, and also in a plurality of low-k dielectric materials so that typically respective conductive and dielectric barrier layers, depending on the process strategy, may be necessary for reliably confining the copper within the metal region 103. For example, in the embodiment shown, a corresponding conductive barrier material 103A may be provided, for instance, in the form of tantalum, tantalum nitride, titanium, titanium nitride and the like, in order to confine the copper in the region 103. Similarly, the barrier material for confining the metal region 103 may have to also provide diffusion blocking characteristics with respect to reactive components, such as oxygen, fluorine and the like, which may exist in minute amounts within the dielectric layer 102. Similarly, the exposed surface 103S may have to be typically covered by an appropriate barrier material which in illustrative embodiments may be provided in the form of a substantially insulating barrier material in order to confine the metal in the region 103 during the further processing and also provide a certain degree of etch selectivity when forming respective contacts to the metal region 103, as will be described later on in more detail. As previously explained, many approaches have been proposed so as to selectively cover the exposed surface 103S by appropriate species, such as silicon carbide, silicon nitride or even conductive barrier materials, wherein, however, inferior process control in combination with reduced mechanical stability may occur. According to the techniques disclosed herein, an appropriate substantially insulating barrier material may be provided on the exposed surface 103S and the dielectric layer 102 on the basis of a highly controllable deposition process, as will be described later on.

The microstructure device 100 as shown in FIG. 1a may be formed on the basis of any well-established process techniques, wherein, for instance, the dielectric layer 102 may be formed on the basis of any appropriate deposition process and may subsequently be patterned on the basis of lithography, such as photolithography, in combination with appropriate etch techniques, in order to form a respective opening which, in sophisticated applications, may have lateral dimensions of 100 nm and less. For instance, a respective trench may be formed in the dielectric layer 102 having a width of 100 nm and less, while a length of the respective trench may be in the range of several tenths of micrometers when, for instance, respective metal lines of a metallization layer of a semiconductor device are considered. Thereafter, the barrier material 103A may be deposited, for instance, on the basis of well-established deposition techniques, such as CVD, physical vapor deposition (PVD), ALD, electrochemical deposition techniques and the like, wherein the corresponding material compositions of the barrier material 103A may be selected with respect to adhesion and barrier characteristics. Next, the material of the metal region 103, i.e., in illustrative embodiments, the copper-containing metal, may be provided, for instance, on the basis of a wet chemical deposition technique, wherein typically a substantially non-planar surface topography may be created which may need to be planarized in a subsequent process step. For instance, chemical mechanical polishing (CMP) may frequently be used in order to remove any excess material stemming from the previously performed processes, such as barrier material, copper-containing metal and the like. During the corresponding planarization process, the exposed surface 103S may be formed, wherein contact to reactive components may result in surface contaminations.

In advanced semiconductor devices, the metal region 103 may have to accommodate for extremely high current density during operation, in combination with thermal stress caused by the heat dissipation, which may give rise to a stress-induced mass transport within the region 103. Electromigration, as one important aspect of stress-induced material transport phenomena in metal lines, can be understood as the migration of atoms in a metal-containing region, wherein the migration of the metal atoms is caused by the momentum transfer from conducting electrons. In a copper-based metal region, the electromigration is substantially driven by interface and surface diffusion. Consequently, it is of high importance to provide enhanced surface characteristics at the surface 103S, on which a further material has to be formed during the further processing, wherein the respective interface characteristics may significantly determine the performance and reliability of the metal region 103. Typically, during the preceding manufacturing processes, such as the CMP process, the exposed surface 103S may come into contact with reactive components, such as moisture, oxygen, fluorine and the like, which may finally result in the formation of copper oxide contaminants on the surface 103S. Therefore, copper oxide is well known as providing respective diffusion paths and thus, during operation, increased electromigration-induced degradation of the region 103 may be observed. Hence, it may be important to clean the surface 103S prior to forming a respective barrier material thereon. In many conventional approaches, the deposition of well-approved dielectric barrier materials, such as silicon nitride, silicon carbide and the like, may be preceded by a respective plasma-based cleaning process so as to remove copper oxide from the surface 103S. It is believed, however, that a corresponding plasma-based cleaning process may result in surface modifications and thus may damage the surface 103S, which may finally result in a less stable interface between the surface 103S and the dielectric barrier material still to be formed.

Thus, according to one illustrative embodiment, a treatment 104 may be performed in the absence of a plasma in order to remove or at least modify the surface 103S so as to significantly reduce any copper oxide areas thereon. In one illustrative embodiment, the treatment 104 may be performed on the basis of a nitrogen-containing gas in combination with an appropriate carrier gas, such as helium, to remove copper oxide in the surface 103S. For instance, ammonia ($NH_3$) may be used in combination with helium to initiate a chemical reaction with the copper oxide species, wherein a corresponding substrate temperature may range from room temperature up to approximately 500° C. The corresponding chemical reaction may be described by the following equation:

$$Cu_XO_Y + NH_3 \rightarrow CuN(H) + H_2O + N_2$$

Consequently, copper oxide may be efficiently converted into copper nitride including respective NH groups. Due to the absence of a plasma, that is, the process 104 may be considered as a thermally driven reaction, respective surface damage in the exposed surface 103S may be substantially avoided. Furthermore, the surface of the dielectric layer 102 may not be substantially affected by the treatment 104, thereby maintaining superior surface characteristics of the layer 102 for the subsequent process steps.

Figure 1B:
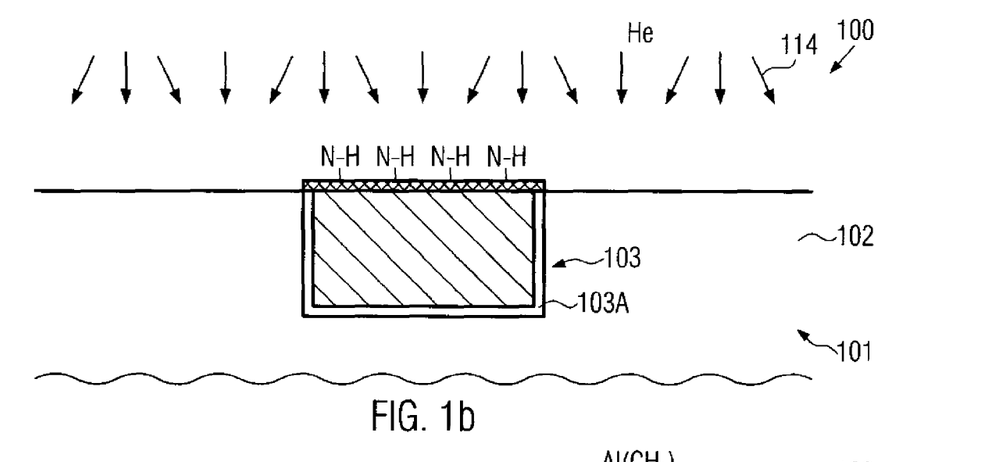

FIG. 1b schematically illustrates the microstructure device 100 after the treatment 104. Thus, the surface 103S may have formed therein copper nitride wherein respective NH groups may be present at the surface thereof, which may provide respective chemical bonds during the subsequent self-limiting deposition process. The device 100 as shown in FIG. 1b may be subjected to an appropriate purge step 114, for instance on the basis of helium, prior to establishing a respective deposition atmosphere.

Figure 1C:
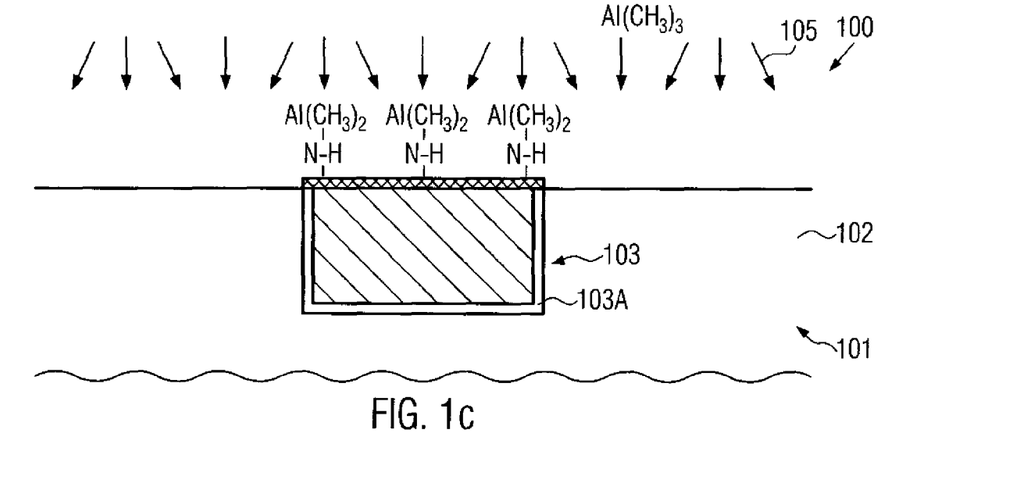

FIG. 1c schematically illustrate the microstructure device 100 when exposed to a gaseous ambient 105 which, in illustrative embodiments, comprises an aluminum-containing gas. For example, $Al(CH_3)_3$ may be used in the gaseous ambient 105 in order to initiate a chemical reaction with the NH groups that are present in the surface 103S due to the previous treatment 104. The corresponding chemical reaction may be initiated by a corresponding activation mechanism, for instance based on a plasma established in the atmosphere 105 or by any other mechanisms, such as radiation induced decomposition, electron beam induced activation and the like. Consequently, the aluminum-containing component may react with the NH groups, wherein the corresponding reaction mechanism is self-limiting, thereby providing highly controllable and reproducible process conditions. As illustrated, a corresponding atomic surface layer may be formed on the exposed surface 103S, which in the illustrated example shown may be comprised of an $N-AL(CH_3)_2$ species.

Figure 1D:
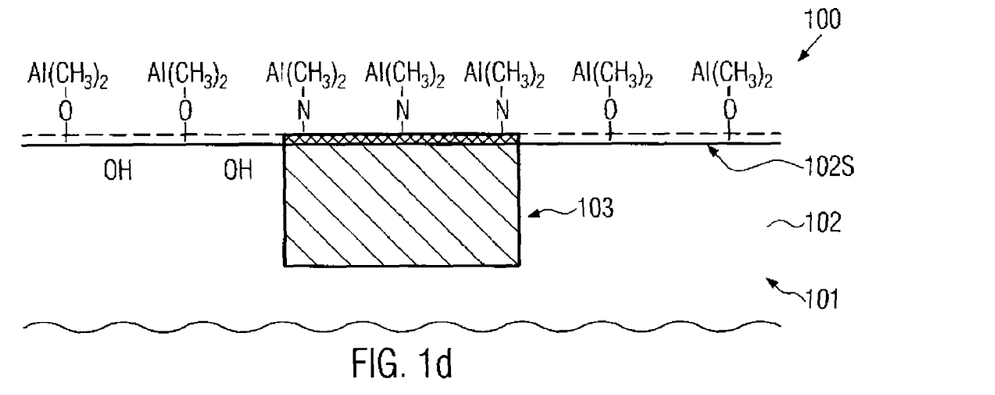

FIG. 1d schematically illustrates the microstructure device 100 according to further illustrative embodiments, in which the material of the dielectric layer 102, at least at a surface layer thereof, may include an appropriate species so as to also enable a chemical reaction with the aluminum-containing gas. For example, the dielectric material of the layer 102 may be comprised of a material including silicon, oxygen and hydrogen, thereby providing respective OH groups at a surface layer 102S, wherein the corresponding OH groups may react with the aluminum-containing precursor gas to also form an atomic surface layer on the dielectric layer 102. Thus, also in this case, the chemical reaction with the dielectric layer 102 is self-limiting, wherein, due to the chemical nature of the bonds with the underlying materials, the respective surface layer may exhibit a high degree of adhesion, irrespective of whether the layer is formed on the metal region 103 or the dielectric layer 102. Thereafter, the corresponding ambient of the device 100 may be purged, for instance on the basis of helium, wherein a corresponding plasma may also be shut off, when a plasma is used for initiating the chemical reaction. In other cases, the corresponding supply of activation energy may be stopped during the corresponding purging process.

Figure 1E:
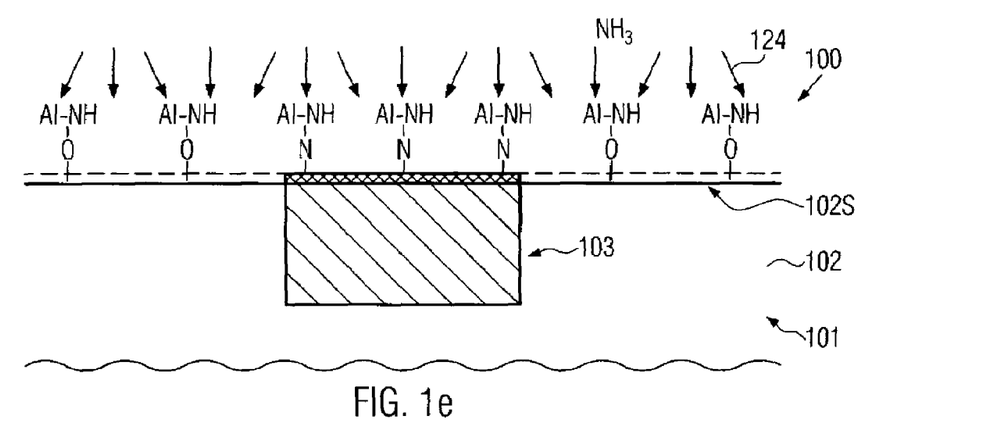

FIG. 1e schematically illustrates the microstructure device 100 during a further treatment 124 performed to replace the respective $CH_3$ groups by NH groups, thereby also creating a respective aluminum nitride surface layer above the metal region 103 and the dielectric layer 102. For example, ammonia may be used wherein a corresponding activation energy may be supplied, for instance by radiation, heat, plasma and the like. Thus, a highly controllable aluminum nitride layer with respective hydrogen bonds may be established, which may now be used as a basis for growing an aluminum nitride layer on the basis of further ALD cycles, thereby providing a high degree of controllability with respect to layer thickness. That is, the device as shown in FIG. 1e may be exposed to the atmosphere 105 (FIG. 1c), thereby forming a further atomic layer wherein a respective aluminum-containing species is bonded to the nitrogen-hydrogen bonds, thereby replacing the hydrogen atoms. Subsequently, a further cycle, for instance on the basis of ammonia, may follow in order to convert the corresponding $CH_3$ groups into respective NH groups, as shown in FIG. 1e.

Figure 1F:
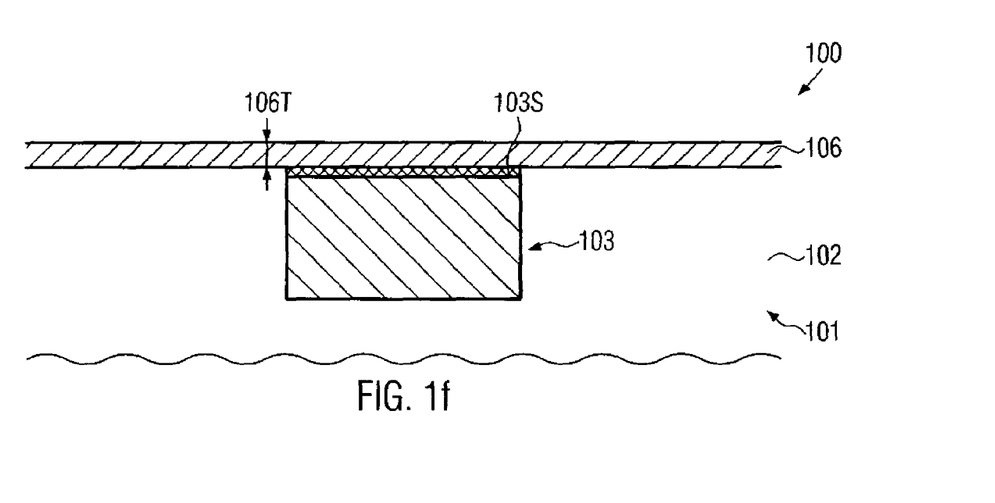
FIG. 1f schematically illustrates the microstructure device having formed thereon a dielectric barrier layer with a specified thickness controlled by the number of deposition cycles of the ALD-like deposition process according to illustrative embodiments.

FIG. 1f schematically illustrates the microstructure device after the above ALD-like deposition process in order to form an aluminum and nitrogen containing layer 106, wherein a thickness thereof, indicated as 106T, may be controlled based on the number of cycles performed in accordance with the previously described sequence. Thus, the thickness 106T may be adjusted in accordance with device requirements with high precision and good step coverage if the layer 106 is to be formed in a patterned dielectric material, if a corresponding substantially insulating barrier material may be required. Furthermore, depending on the initial thickness of the corresponding copper oxide contaminations in the surface layer 103S (FIG. 1a), a portion of the surface layer 103S, comprising copper nitride, may still be present and may provide superior surface characteristic due to the diffusion blocking characteristics of the nitrogen material. In other illustrative embodiments, the nitrogen in the surface layer 103S may be substantially bonded to the atomic species of the overlying layer 106. Also, in this case, superior interface characteristics may be achieved, wherein the significant copper diffusion blocking characteristics of the layer 106, for instance when provided as an aluminum nitride layer, may provide the desired confinement of the copper material within the region 103, which may be assisted by respective copper nitride material of the surface portion 103S. Furthermore, as aluminum nitride has a capability of absorbing oxygen, moisture and the like, the integrity of the surface 103S remains moderately stable over time, thereby also contributing to a superior reliability of the metal region 103.

In some illustrative embodiments, the further processing may be continued by depositing an appropriate dielectric material directly on the barrier layer 106, for instance by any appropriate deposition process, wherein the dielectric material may represent a low-k dielectric material for a subsequent metallization level. Consequently, compared to conventional strategies, the interface characteristics between copper and an insulating material may be enhanced on the basis of a highly controllable layer thickness, thereby providing the potential for significantly reducing the amount of any additional dielectric barrier material, which may conventionally significantly contribute to the overall permittivity of the resulting layer stack. During a subsequent process for patterning a corresponding dielectric material that may be directly formed on the barrier layer 106, the material thereof may be used as an etch stop material or at least an etch indicator material, for instance upon release of the aluminum species, so that a corresponding patterning process may be reliably controlled on the basis of the barrier layer 106. In other cases, a corresponding etch process may be controlled on the basis of the exposure of the material of the region 103, if the barrier layer 106 is provided with a reduced thickness 106T or may not provide efficient etch control capabilities.

Figure 1G:
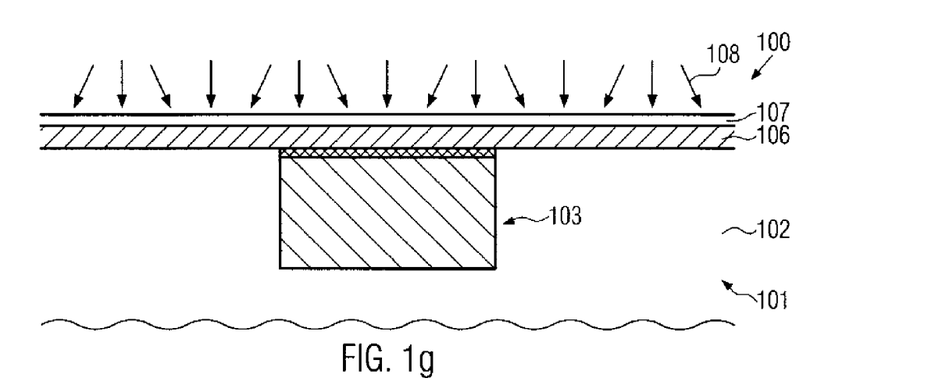
FIG. 1g schematically illustrates the microstructure device according to still further illustrative embodiments.

FIG. 1g schematically illustrates the microstructure device 100 according to a further illustrative embodiment. In this case, a deposition process 108 may be performed to provide a further dielectric material 107, which may have respective barrier characteristics and/or etch stop characteristics for assisting in the further processing of the device 100. For instance, the layer 107 may represent a well-established barrier/etch stop material, such as silicon nitride, silicon carbide, nitrogen-enriched silicon carbide or any appropriate mixture of these materials, in order to further enhance the integrity of the copper material in the region 103 and/or provide superior etch stop capabilities during the further processing. However, contrary to conventional strategies, the composition of the layer 107, for instance in terms of respective sub-layers, materials and the like, may be selected with respect to etch stop specific characteristics rather than requiring both superior diffusion blocking characteristics and etch stop capabilities. Thus, an increased degree of flexibility in selecting respective materials may be achieved. Furthermore, due to the provision of the barrier layer 106, a thickness of the material 107 may be adjusted to a significantly lower value compared to conventional strategies, thereby significantly reducing the presence of materials of moderately high permittivity, which may contribute to a reduced overall parasitic capacitance of the resulting layer stack. For instance, if enhanced etch stop capabilities may be desired, the layer 107 may be formed by any appropriate material, wherein even silicon dioxide may be used which is known to allow copper diffusion, since the barrier layer 106 may provide the required copper diffusion blocking characteristics. In some illustrative embodiments, the deposition process 108 may be performed in situ with the process sequence as previously described with reference to FIGS. 1a-1f, thereby significantly reducing process complexity and enhancing tool utilization and overall process throughput. In this respect, an in situ process is to be considered as a sequence of manufacturing processes which are performed in the same process chamber of a process tool without any intermediate transport activities. For example, the deposition process 108 may be performed in an appropriate CVD chamber, which may also enable the creation of an appropriate plasma ambient that may supply the corresponding activation energies during the previous ALD-like deposition sequence. In other illustrative embodiments, the layers 106 and 107 may be formed in separate dedicated process tools.

Furthermore, any further dielectric material, such as a low-k dielectric material for a subsequent metallization level, may be deposited on the basis of any appropriate technique, such as CVD, PECVD, spin-on techniques and the like, wherein, in the case of a CVD deposition, the process sequence for forming the barrier layer 106 and a corresponding deposition of the low-k dielectric material may also be performed as an in situ process sequence.

Figure 1H:
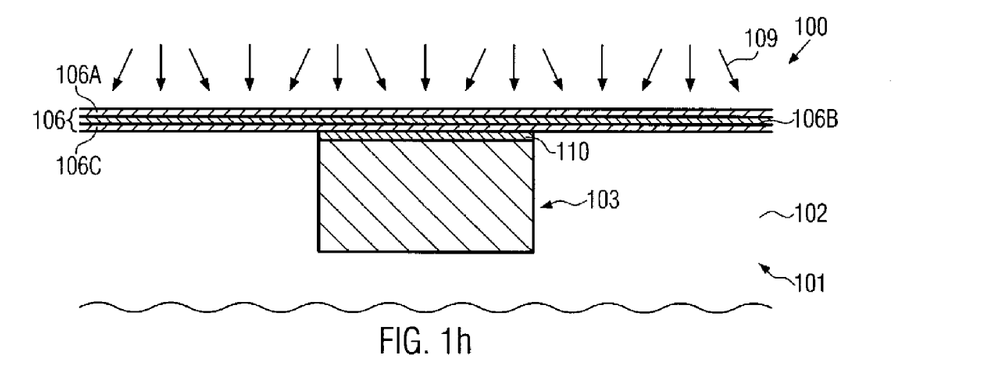
FIG. 1h schematically illustrates the microstructure device comprising a plurality of individual dielectric barrier layers according to still further illustrative embodiments.

FIG. 1h schematically illustrates the microstructure device 100 in accordance with further illustrative embodiments. As shown, the device 100 may be subjected to a deposition process 109, which may represent an ALD-like process on the basis of appropriate materials in order to provide the barrier layer 106 in the form of several sub-layers, depending on device requirements. For instance, the layer 106 may be comprised of respective sub-layers 106A, 106B, 106C wherein one of these sub-layers may be provided in the form of an aluminum nitride layer manufactured on the basis of the process sequence as described above. For example, the layer 106C may be provided in the form of an aluminum nitride layer. Thereafter, the process 109 may be performed to provide a different material composition on the basis of a self-limiting process sequence in order to specifically design the overall characteristics of the barrier layer 106. For example, respective precursor gases may be selected to form respective bonds with the corresponding NH groups of the layer 106C, thereby specifically designing the properties of the layer 106. For example, respective functional groups in precursor gases may be designed in accordance with device requirements, for instance by incorporating respective species, such as silicon, nitrogen and the like, in order to specifically adjust the diffusion blocking characteristics, the etch stop capabilities and the like. If required, the process sequence 109 may then be continued on the basis of a different precursor gas in order to form the layer 106A. Consequently, based on the self-limiting process 109, a variety of respective barrier materials may be created, wherein the corresponding characteristics may be specifically adjusted by providing a plurality of sub-layers. In some illustrative embodiments, prior to performing the process 109 or the self-limiting process sequence as previously described with reference to FIGS. 1a-1f, a spatially selective process may be performed in order to provide a cap layer 110 above the surface 103S, wherein the cap layer 110 may be comprised of a dielectric material or a conductive material, depending on the process strategy. For example, respective metal alloys may be provided selectively on the surface 103S, wherein the corresponding materials may exhibit enhanced interface characteristics, while the corresponding etch stop capabilities and copper-confining characteristics may not be sufficient for advanced microstructure devices. In this case, the layer 106 may be formed, for instance as previously shown or in combination with the process 109, to provide the overall desired characteristics, i.e., a high degree of interface integrity in combination with a low overall permittivity.

As a consequence, by using at least an ALD-like deposition sequence for forming a substantially insulating material on an exposed surface of a metal region, enhanced flexibility in selecting appropriate materials with increased process controllability may be achieved, while at the same time performance and reliability of microstructure devices may be increased, in particular if copper-containing metallization structures are considered. In some illustrative embodiments, additional barrier layers, for instance in the form of well-established materials such as silicon nitride, silicon carbide, nitrogen-enriched silicon carbide and the like, may be omitted and a corresponding low-k dielectric material may be directly formed on the substantially insulating barrier material provided by an ALD-like deposition technique. In the case of copper-containing metal regions, superior chemical, mechanical characteristics and enhanced adhesion may be achieved by the chemical bonding of the barrier layer with the underlying materials, wherein, for instance, an aluminum nitride layer may be used in combination with copper and a plurality of low-k dielectric materials. Furthermore, in the corresponding pre-treatment for preparing the copper-containing surface for the subsequent self-limiting deposition process, significant damage of the surface may be avoided by performing a corresponding process in the absence of any plasma ambient. Furthermore, as previously described, the corresponding sequence for forming the barrier layer 106 may be implemented as an in situ sequence, wherein, in some illustrative aspects, the deposition of any further materials, such as low-k dielectric materials, additional barrier materials and the like, may also be performed as in situ processes.

Figure 2A:
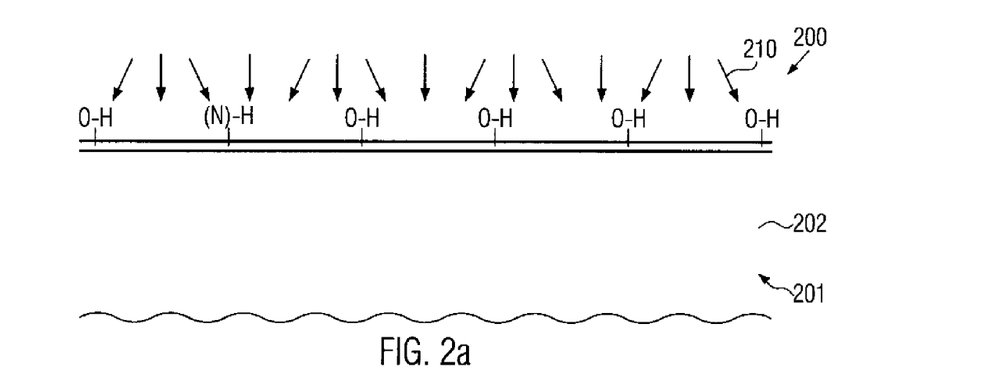
FIGS. 2a-2b schematically illustrate cross-sectional views of the microstructure device during various manufacturing stages in forming a copper-containing region and preparing the respective dielectric material for receiving an aluminum nitride layer according to other illustrative embodiments.
Figure 2B:
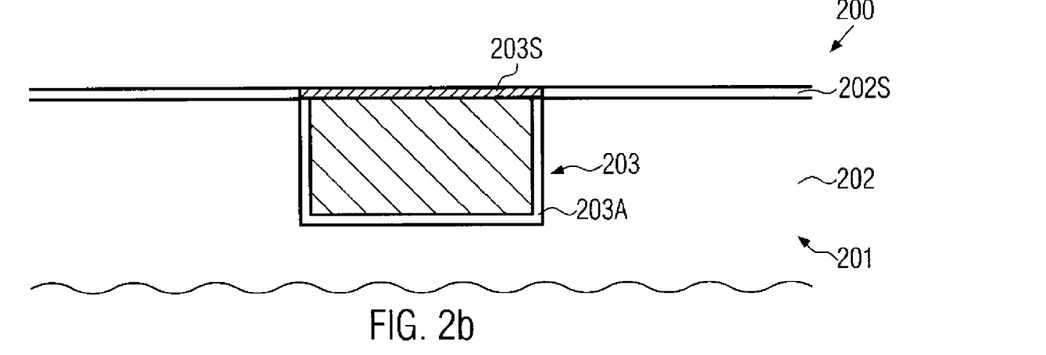
Figure 2C:
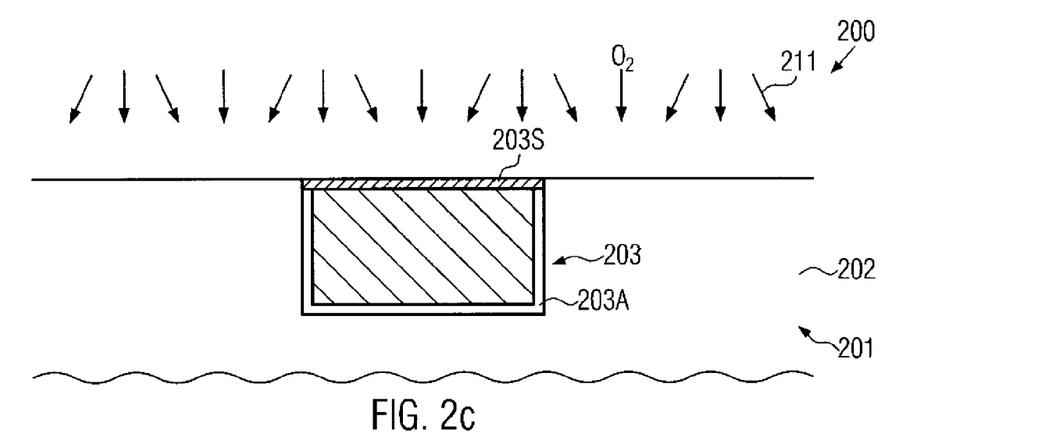
FIG. 2c schematically illustrates a cross-sectional view of the microstructure device during a treatment for providing a substantially uniform copper oxide surface according to illustrative embodiments.

With reference to FIGS. 2a-2c, further illustrative embodiments will now be described in which respective pre-treatments may be performed prior to the formation of a barrier layer on the basis of an ALD-like deposition sequence.

FIG. 2a schematically illustrates a microstructure device 200 at a manufacturing stage in which the device 200 comprises a substrate 201, which may have formed therein any circuit elements, as is previously explained with reference to the substrate 101. Furthermore, the device 200 may comprise a dielectric layer 202, which may represent the dielectric material of a metallization layer or any other device level, in which a metal region, such as a copper-containing region, is to be formed. In the embodiment illustrated, the dielectric layer 202 may represent a low-k dielectric material which may have any appropriate material composition in accordance with device requirements. For example, the dielectric layer 202 may be formed of any material which may not provide the corresponding surface characteristics as required for the subsequent self-limiting deposition of a barrier material. For instance, the layer 202 may be comprised of porous silicon, porous silica and the like or any other low-k dielectrics. Consequently, the device 200 may be exposed to a treatment 210 to provide a corresponding surface layer 202S (FIG. 2B) comprising an appropriate chemical composition in order to allow the subsequent bonding to a corresponding species, such as an aluminum and nitrogen containing species. For instance, the treatment 210 may comprise the deposition of an appropriate material, such as a silicon, oxygen and hydrogen containing material, for which well-established compositions are available in the art. Thus, the treatment 210 may be performed as a CVD process for forming the surface layer 202S with the required thickness. In other cases, the treatment 210 may comprise the deposition of a nitrogen and hydrogen-containing material or may include a corresponding plasma-based treatment for incorporating oxygen or nitrogen into the surface portion of the dielectric layer 202 to form the surface layer 202S.

Thereafter, the further processing of the device 200 may be continued by appropriately patterning the dielectric layer 202 on the basis of well-established recipes and photo-lithographic techniques. In some illustrative embodiments, the dielectric layer 202 may be patterned first and may be subsequently treated during the process 210 in order to form a respective surface layer 202S at any exposed surface.

FIG. 2b schematically illustrates the device 200 in a further advanced manufacturing stage wherein a copper-containing region 203 is formed within the dielectric layer 202, wherein the region 203 may comprise a conductive barrier layer 203A and an exposed surface 203S, as previously described with reference to the device 100. Thus, respective manufacturing sequences may also be used for the device 200. That is, after forming the copper-containing region 203, the exposed surface 203S may comprise a significant amount of copper oxide, while the surface layer 202S may have a corresponding configuration to allow the subsequent adhesion of a precursor gas as previously described. Hence, the device 200 as shown in FIG. 2b may be subjected to the process sequence as described with reference to FIGS. 1a-1e in order to form a respective barrier layer on the basis of a self-limiting process, wherein the modified surface 202S provides a continuous deposition above the region 203 and the dielectric layer 202, which may per se not be appropriate for the self-limiting deposition sequence.

FIG. 2c schematically illustrates the device 200 according to a further illustrative embodiment, in which the device 200 may be subjected to a treatment 211 designed to prepare the exposed surface 203S for the subsequent process sequence for forming a barrier layer thereon, as previously described. In some illustrative embodiments, the treatment 211 may comprise an oxidation process, for instance performed on the basis of a wet chemical process, a plasma-assisted process, a thermal oxidation process and the like, to form a substantially continuous copper oxide layer on the exposed surface 203S. In this case, a substantially continuous and well-defined copper oxide layer may be formed, which may also act as a passivation layer during the further handling of the substrate 200 prior to the actual deposition of a barrier material in accordance with the self-limiting sequence described before. Consequently, in this case, the treatment as described with reference to FIG. 1a, i.e., the treatment 104 for converting copper oxide into copper nitride including hydrogen, may be performed on the basis of uniform surface conditions, wherein the corresponding surface 203S may exhibit an increased integrity due to the passivating characteristics during the further substrate handling activities. Consequently, the surface 203S may be formed, for instance, immediately after the corresponding CMP process, with high uniformity, while subsequent process activities may not significantly contribute to any surface irregularities due to the passivating copper oxide layer at the surface 203S.

In other illustrative embodiments, the treatment 211 may include the selective incorporation of nitrogen by wet chemical recipes on the basis of appropriate precursor materials so that, in this case, the treatment 104, as illustrated in FIG. 1a, may be omitted and the corresponding formation of the barrier layer in a self-limiting process sequence may be started by introducing an aluminum-containing gas, as is for instance shown in FIG. 1c.

Figure 3A:
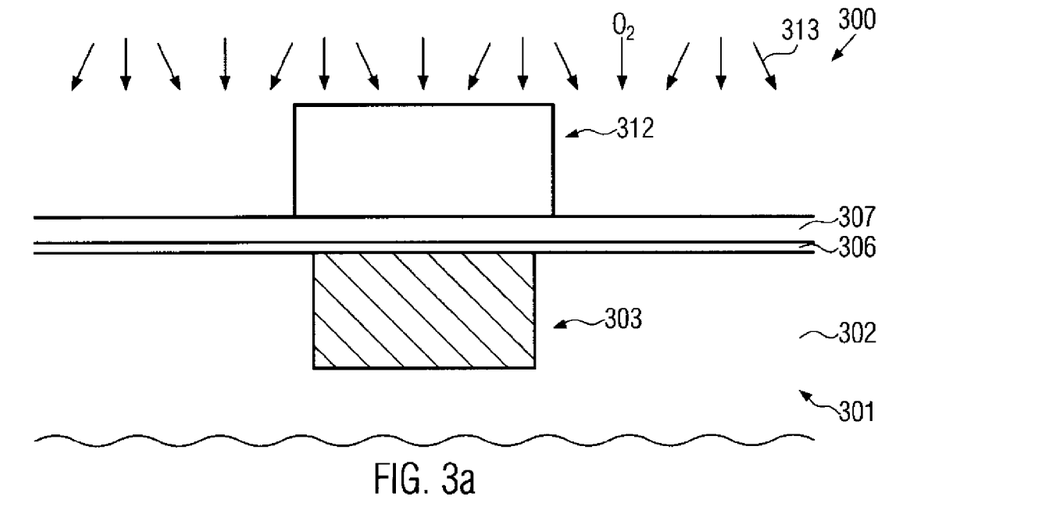
FIGS. 3a-3b schematically illustrate a cross-sectional view and a top view, respectively, when forming an additional barrier or etch stop layer on the aluminum and nitride containing barrier layer according to further illustrative embodiments.
Figure 3B:
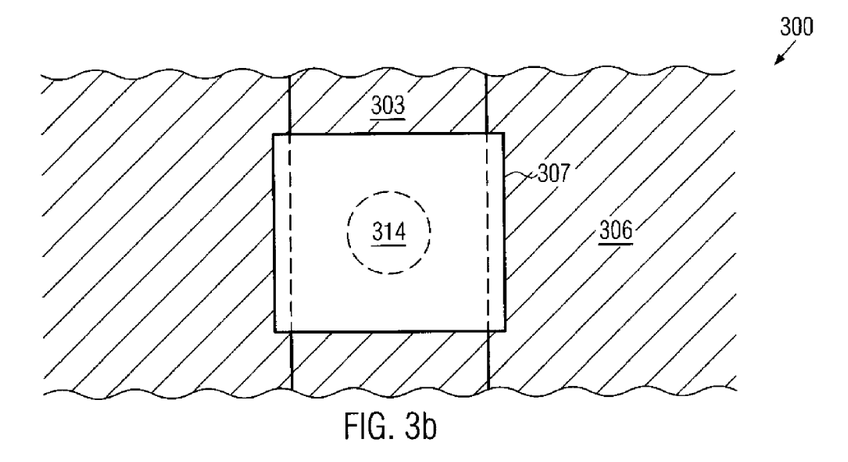

With reference to FIGS. 3a-3b, further illustrative embodiments will now be described in which a barrier layer, such as the barrier layer 106, may be formed in combination with an etch stop layer which may be patterned to significantly reduce the overall permittivity of the resulting layer stack.

FIG. 3a schematically illustrates a microstructure device 300 comprising a substrate 301, a dielectric layer 302 formed thereon, a metal region 303 embedded into the dielectric layer 302 and an insulating barrier layer 306. With respect to the components described so far, the same criteria apply as previously described with reference to the devices 100 and 200. Hence, the barrier layer 306 may represent, for instance, an aluminum nitride layer formed on the basis of the self-limiting process sequence, as previously described. Furthermore, the device 300 may comprise an etch stop layer 307, comprised of a material that exhibits a desired high etch selectivity during a subsequent etch process for patterning a dielectric material to be formed in a later manufacturing stage for forming a further metallization level of the device 300. Hence, any appropriate material, such as silicon nitride and the like, may be used, irrespective of the relative permittivity thereof, since the layer 307 may be patterned by a corresponding etch process 313 on the basis of a corresponding resist mask 312. That is, the material of the layer 307 may be removed at any areas in which etch stop capabilities may not be required during the further processing, thereby significantly reducing the respective influence on the overall permittivity of the layer stack, while nevertheless providing a reliable patterning sequence in subsequent processes. The process 313 may be performed as a wet chemical etch process, a dry etch process and the like, on the basis of an appropriate etch chemistry, wherein the barrier layer 306 may act as an etch stop.

FIG. 3b schematically illustrates the device 300 in a top view after the etch process 313 and the removal of the resist mask 312. In this illustrative embodiment, the etch stop layer 307 may also be removed from portions above the metal region 303, and may be maintained only at a portion at which a corresponding via 314, indicated by dashed lines, may have to be formed in a subsequent manufacturing stage when patterning a corresponding dielectric material for connecting to the region 303. Consequently, the corresponding etch process may be performed with high reliability, while the barrier layer 306 may provide the desired mechanical strength and the diffusion blocking characteristics above the metal region 303.

Figure 4A:
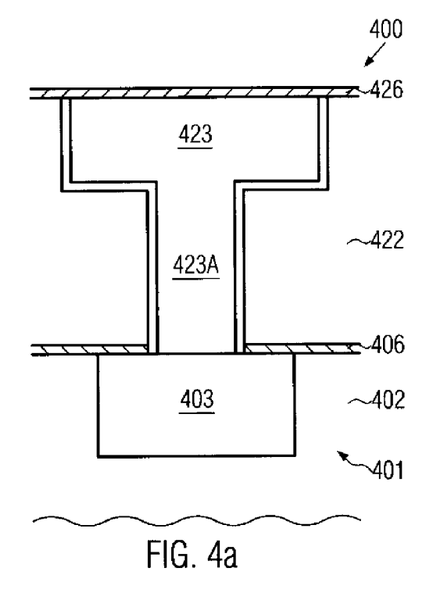
FIGS. 4a-4b schematically illustrate cross-sectional views of a semiconductor device comprising a metallization layer based on a dielectric barrier layer formed in accordance with a self-limiting process according to further illustrative embodiments.
Figure 4B:
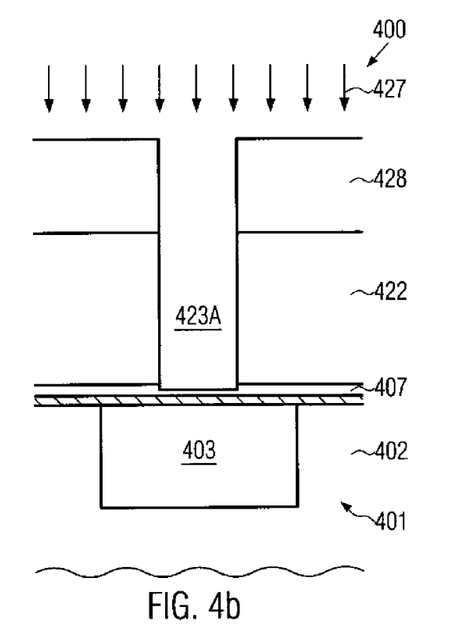

With reference to FIGS. 4a-4b, respective semiconductor devices are described in which the self-limiting barrier material may be used in a metallization layer stack. FIG. 4a schematically illustrates a cross-sectional view of a semiconductor device 400 comprising a substrate 401 above which may be formed a dielectric layer 402 having incorporated therein a conductive region 403. For instance, the dielectric layer 402, in combination with the conductive region 403, may represent a metallization level of the device 400, while, in other cases, the conductive region 403 may represent any contact area of a circuit element formed in and above the substrate 401. In one illustrative embodiment, the conductive region 403 may comprise a copper-containing region, for instance in the form of a metal line, wherein a corresponding barrier layer 406 may provide the required integrity of the copper material within the region 403. The barrier material 406 may represent, in one illustrative embodiment, an aluminum nitride layer, i.e., an aluminum and nitrogen-containing layer formed on the basis of a self-limiting process sequence, as previously described. Furthermore, the device 400 comprises a dielectric material 422 which may be provided, at least partially, as a low-k dielectric material in which may be embedded a metal line 423, for instance a copper-comprising line that is connected to the metal region 403 by a corresponding via 423A. Furthermore, a corresponding barrier layer 426 may cover the metal line 423, wherein the barrier layer 426 may be provided in the form of an aluminum and nitrogen-containing material that may be formed on the basis of a self-limiting process sequence as previously described.

The components 401, 402 and 403 may be formed on the basis of well-established techniques followed by a deposition technique for the material of the layer 406, as previously described. Thereafter, the dielectric material 422 may be directly deposited on the layer 406 and may be subsequently patterned on the basis of well-established patterning regimes. Thereafter, the layer 426 may be formed, as previously described.

FIG. 4b schematically illustrates the device 400 in accordance with a further illustrative embodiment in which an etch stop layer 407 is provided, at least locally, above the barrier layer 406 in order to enhance control of a respective patterning process 427 performed on the basis of a corresponding etch mask 428 designed to provide an opening for the via 423A. Since the etch stop layer 407 may be specifically designed to control the process 427, any appropriate material with a significantly reduced thickness compared to conventional strategies may be used, since the corresponding interface characteristics may be provided by the barrier layer 406.

With respect to any process strategy for forming the dielectric layer 422, irrespective of whether the etch stop layer 407 is provided or not, the same criteria apply as previously explained. That is, the sequence for forming the barrier layer 406 and the deposition of the dielectric material of the layer 422, possibly in combination with the deposition of the etch stop layer 407, may be performed as an in situ sequence, thereby enhancing tool utilization and process throughput.

As a result, the subject matter disclosed herein provides a technique for enhancing performance of metallization structures in advanced semiconductor devices while at the same time maintaining the overall permittivity of the interlayer dielectric material at a lower level. For this purpose, an ALD-like deposition process may be performed to deposit an efficient barrier material in a highly controllable manner, thereby providing the potential of omitting any further barrier material or at least significantly reducing the amount thereof. In illustrative embodiments, an aluminum nitride layer is formed by a self-limiting process sequence wherein aluminum nitride provides copper diffusion blocking characteristics and also exhibits superior getter capabilities with respect to oxygen and moisture.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a nitrogen-containing layer on an exposed surface of a metal region formed in a dielectric layer; and
    exposing said nitrogen-containing layer to an ambient established on the basis of an aluminum-containing gas to form an aluminum and nitrogen-containing first barrier layer on said metal region.

2. The method of claim 1, wherein said metal region comprises copper.

3. The method of claim 2, wherein forming said nitrogen-containing layer comprises treating said exposed surface to convert copper oxide into copper nitride.

4. The method of claim 3, wherein treating said exposed surface comprises establishing an ammonium ($NH_3$) containing ambient.

5. The method of claim 1, wherein said aluminum-containing gas comprises $Al(CH_3)_3$.

6. The method of claim 1, further comprising forming a second dielectric barrier layer on said first barrier layer and forming a low-k dielectric material above said second dielectric barrier layer.

7. The method of claim 6, wherein said first barrier layer and said second dielectric layer are formed in an in situ process.

8. The method of claim 3, wherein treating said exposed surface comprises thermal activation in the absence of a plasma.

9. The method of claim 1, further comprising forming a low-k dielectric material on said aluminum and nitrogen-containing first barrier layer.

10. The method of claim 3, further comprising forming said copper oxide in an oxidizing ambient as a substantially continuous copper oxide layer.

11. The method of claim 1, wherein said aluminum and nitrogen-containing first barrier layer is formed on said dielectric layer.

12. The method of claim 11, further comprising forming said dielectric layer so as to have OH groups at least at a surface thereof.

* * * * *